US009593428B2

(12) United States Patent
Loermans

(10) Patent No.: US 9,593,428 B2
(45) Date of Patent: Mar. 14, 2017

(54) DEVICE FOR SINGLE-SIDED ELECTROLYTIC TREATMENT OF A FLAT SUBSTRATE

(75) Inventor: Peter Jacobus Gerardus Loermans, Bergharen (NL)

(73) Assignee: MECO EQUIPMENT ENGINEERS B.V., Drunen (NL)

( * ) Notice: Subject to any disclaimer, the term of this patent is extended or adjusted under 35 U.S.C. 154(b) by 749 days.

(21) Appl. No.: 13/878,097

(22) PCT Filed: Oct. 6, 2011

(86) PCT No.: PCT/NL2011/050675
§ 371 (c)(1),
(2), (4) Date: Jun. 18, 2013

(87) PCT Pub. No.: WO2012/047102
PCT Pub. Date: Apr. 12, 2012

(65) Prior Publication Data
US 2014/0076732 A1 Mar. 20, 2014

(30) Foreign Application Priority Data
Oct. 7, 2010 (NL) ...................................... 2005480

(51) Int. Cl.
*C25D 17/06* (2006.01)
*C25D 5/02* (2006.01)
(Continued)

(52) U.S. Cl.
CPC ........... *C25D 5/028* (2013.01); *C25D 17/001* (2013.01); *C25D 17/005* (2013.01); *C25D 17/06* (2013.01);
(Continued)

(58) Field of Classification Search
CPC ...... C25D 17/001; C25D 17/005; C25D 17/06
See application file for complete search history.

(56) References Cited

U.S. PATENT DOCUMENTS 4,425,213 A * 1/1984 Laverty .................... C25D 5/02
  204/202
4,776,939 A 10/1988 Blaesing et al.
  (Continued)

FOREIGN PATENT DOCUMENTS

DE  102009004249 A1   7/2009
JP     2002-069698  *  3/2002  ............. C25D 17/12
JP     2009-197291  *  9/2009  ............. C25D 17/00

OTHER PUBLICATIONS

International Search Report mailed Oct. 26, 2012, International Patent Application No. PCT/NL2011/050675.

*Primary Examiner* — Stefanie S Wittenberg
(74) *Attorney, Agent, or Firm* — Casimir Jones, SC

(57) ABSTRACT

The present invention provides a device for single-sided electrolytic treatment of a flat substrate. The device comprises a bath for electrolytic fluid and conveying means for conveying the flat substrate in a conveying direction at the free surface of the fluid in the bath, with the flat substrate being horizontally oriented such that the underside of the flat substrate makes contact with the free surface of the fluid in the bath. The conveying means comprise two conveying elements disposed opposite each other, which extend along two respective conveying paths, which conveying paths each comprise an electrolytic part, which electrolytic parts extend on two opposite longitudinal sides of the bath.

29 Claims, 9 Drawing Sheets

(51) Int. Cl.
    *C25D 17/00*      (2006.01)
    *H01L 31/032*     (2006.01)
    *H01L 31/18*      (2006.01)
(52) U.S. Cl.
    CPC .......... *H01L 31/0322* (2013.01); *H01L 31/18* (2013.01); *Y02E 10/541* (2013.01)

(56) References Cited

U.S. PATENT DOCUMENTS

| | | | | |
|---|---|---|---|---|
| 4,948,486 | A * | 8/1990 | Hosten | C25D 17/00 204/198 |
| 5,686,829 | A * | 11/1997 | Girault | G01N 27/48 204/412 |
| 5,932,081 | A * | 8/1999 | Kopp | C25D 17/06 118/503 |
| 6,607,652 | B2 * | 8/2003 | Webb | C25D 17/00 205/137 |
| 2002/0020620 | A1 | 2/2002 | Webb et al. | |
| 2003/0121790 | A1 | 7/2003 | Hubel | |
| 2010/0187068 | A1 | 7/2010 | Gutekunst | |

* cited by examiner

DEVICE FOR SINGLE-SIDED ELECTROLYTIC TREATMENT OF A FLAT SUBSTRATE

The present invention relates to a device for single-sided electrolytic treatment of a flat substrate. Such a flat substrate may be formed by a part of a strip that has been unwound from a reel, but also by a discrete plate. Single-sided electrolytic treatment of a flat substrate can be employed, for example, in the manufacture of solar panels. The present invention can be used in particular, but not exclusively, with solar cells wherein a layer of a semiconductor material, generally indicated by the acronym CGIS, is applied to a substrate in the form of a sheet of glass, for example measuring 60 cm×120 cm. Said semiconductor material is composed of copper, indium, gallium and selenium.

The object of the present invention is to provide a device which makes it possible to carry out the process of single-sided electrolytic treatment of a flat substrate as efficiently as possible, so that for example solar cells provided with the aforesaid CIGS semiconductor material can be produced at significantly lower cost.

From German patent application DE 10 2009 004 249 A1 there is known a device for single-sided electrolytic treatment of strip material from a reel. In said device, the strip material is passed through the known device while floating, as it were, on electrolytic fluid in an electrolytic bath, whilst the substrate is held in as flat a position as possible, using compressed air which acts on the strip material from above via an apertured plate, so as to achieve an optimum contact with the electrolytic fluid. A slide bearing is provided both upstream and downstream of the electrolytic bath, onto which the strip is held down by means of two cathodically (negatively) charged rollers. An important drawback of this known device is that the current densities that can be achieved are limited, so that the deposition rate is limited as well. Furthermore, the device is not suitable for single-sided electrolytic treatment of plate-like substrates. The distance from the foil to the anode will fluctuate strongly, due to the unstable equilibrium of fluid pressure at the bottom side and air pressure at the upper side. As a result, the uniformity of the layer thickness will vary strongly. Furthermore, the known device is not suitable for treating substrates in the form of a foil of plastic material with a (or at least at least one) sputtered base layer present thereon.

U.S. patent application US 2003/0,121,790 discusses a number of variants of contact elements for electrolytic treatment of substrates, which contact elements are made of an elastic, electrically conductive material. The contact elements are fully submerged in fluid in use.

The object of the present invention is to provide a device which is (also) suitable for single-sided electrolytic treatment of a plate-like substrate. In order to accomplish that object, the present invention provides a device for single-sided electrolytic treatment of a flat substrate, comprising a bath for electrolytic fluid, conveying means for conveying the flat substrate in a conveying direction at the free surface of the electrolytic fluid in the bath, with the flat substrate being horizontally oriented such that the underside of the flat substrate makes contact with the free surface of the electrolytic fluid in the bath, said conveying means comprising two conveying elements disposed opposite each other, which extend along two respective conveying paths, which two conveying paths each comprise an electrolytic part, which electrolytic parts extend on two opposite longitudinal sides of the bath, wherein each of the two conveying elements comprises at least one carrier body of a dielectric material having, at least at the location of the associated electrolytic part, a support edge directed toward the bath for supporting, with an upper side thereof, the flat substrate on one side thereof, which support edge forms a moving part of a longitudinal wall of the bath, and at least one guide member of an electrically conductive material, which is connected to said at least one carrier body, for cathodically connecting the underside of the substrate on the side of the support edge remote from the bath, said guide member comprising at least one spring means having an upper side which, in unloaded condition, is located above the level of the upper side of the support edge, at least at the location of the bath, the upper side of which spring means is elastically compressible in downward direction under the influence of a downward force exerted on the spring means by the substrate, to the level at which the upper side of the spring means is located at the same level as the upper side of the support edge.

Important advantages of the present invention are the fact that the use of a support edge can provide a very stable support for plate-shaped substrates as well as for strip-shaped substrates. The use of the at least one spring means offers the additional advantage that, in combination with the aforesaid stable support, a very reliable cathodic contacting of the substrate near the electrolytic fluid can moreover be realised, so that field lines can be kept relatively short and high current densities can be achieved. Contacting via the underside moreover makes it possible to make use of substrates which are at least largely made of a dielectric material, but which are only coated on the underside with an electrically conductive layer of, for example, copper, to which layer one or a number of additional layers can be applied by electrolytic means.

In a possible embodiment of the device according to the invention, the support edge forms a screen for preventing the electrolytic fluid coming into contact with said at least one spring means from the bath. Such a screening at least largely prevents any tendency of material to precipitate from the electrolytic bath on said at least one spring means itself, which would necessitate frequent cleaning/are stripping of said at least one spreading means.

Relatively high current densities can be achieved in particular if the conveying means are provided with a number of spring means for each carrier body.

If at least one recess is provided in each support edge for each accommodating at least one spring means associated with the carrier body in question, this will have the advantage that the contact between the spring means and the substrate can take place relatively close to the location of the actual support of the associated substrate by the support edge. Only a minimal part of the substrate, at the edges thereof, is not electrolytically treated on account of the presence of the spring means and the support edge. Preferably, the support edge is provided with a recess for each spring means.

In particular with a view to providing the screening function by the support edge as discussed in the foregoing, it may be advantageous if each support edge has a continuous part on the side facing the bath and if the recesses are provided on the side of the continuous part remote from the bath. Because of the support of the substrate by the support edge, no electrolytic fluid, or at least hardly any electrolytic fluid, can escape from the bath via the upper side of the support edge, so that spring means located behind the support edge are screened from the electrolytic fluid.

If each guide member is provided with a number of spring means, this has the advantage that only one contact with the respective guide member for cathodically connecting said spring means (temporarily) is needed, whilst cathodic contact between the spring means and the substrate will take place at various positions in that case.

A constructionally advantageous embodiment is obtained if the spring means are configured as spring lips.

For reasons of simplicity it may be advantageous in that case if each carrier body is provided with a single guide member.

In case cleaning/stripping of said at least one guide member, more specifically of said at least one spring means thereof, is necessary for process reasons at some point in time, it is preferable if said at least one guide member is exchangeably connected to the associated at least one carrier body. A guide member having fouled spring means, for example, or spring means that otherwise do not function optimally, may even be exchanged without interrupting the process, especially if, according to another possible embodiment, said at least one guide member is connected to the associated at least one carrier body by means of a snap connection.

With a view to cathodically connecting said at least one spring means it is advantageous if the device further comprises cathodic contact means which are in electrically conducting contact, or at least can be placed into electrically conducting contact, with said at least one guide member at the location of the electrolytic part. In particular if the device according to the invention is used in an industrial environment, in which a plurality of guide members are used, the associated spring means can be placed in an electrolytically active state temporarily by bringing a cathodic contact element into temporary contact with a guide member.

In particular in an industrial production environment it may be very advantageous if each of the conveying paths is an endless conveying path, wherein furthermore the successive carrier bodies of each conveying element are interconnected via the conveying element, being pivotable about pivot axes which extend vertically, for example.

An embodiment which is advantageous for constructional reasons is obtained if the conveying elements each comprise an endless conveyor chain which passes over two sprockets, upstream and downstream of the bath, respectively, which sprockets are rotatable about axes of rotation, wherein carrier bodies associated with the respective conveying element are pivotally interconnected via the conveyor chain. With a view to realising an optimum use of the available space it may be advantageous if the axes of rotation extend vertically.

Another possible embodiment is characterised in that the pivot axes are formed by pivot pins of the conveyor chain, which extend outside links of the conveyor chain, which pivot pins pivotally interconnect the links of the conveyor chain.

In order to be able to compensate for the arc-chord effect, it may be advantageous if each conveying element is connected to the associated conveyor chain via two pivot pins, wherein one of the two pivot pins extends into a circular hole provided in the conveying element and the other of the two pivot pins extends into a slotted hole of the conveying element.

In order to realise a continuous change of electrolytic fluid in the bath it is preferable if the bath has two opposite longitudinal walls, whose upper sides extend below the underside of the support wall, and that preferably at most 5 mm, more preferably at most 2 mm.

Alternatively, or in combination with the above-described preferred embodiment, it may furthermore be preferably if the bath has a transverse wall both on the upstream side of the bath and on the downstream side of the bath, the upper sides of which transverse walls extend below the level of the upper sides of the support edge, and that preferably at most 5 mm, furthermore preferably at most 2 mm.

In order to realise an even more efficient change of electrolytic fluid in the bath, and in particular in the direct vicinity of the substrate, which will accelerate the rate at which the electrolytic process takes place, it may be advantageous if the bath is provided with agitator means comprising at least one rotary element which rotates about a further rotary shaft, which further rotary shaft extends transversely to the conveying direction in the fluid in the bath so as to create a counterflow of electrolytic fluid near the substrate.

An effective and homogeneous action of the agitation means is obtained in particular if said at least one rotary element extends over at least substantially the entire width of the bath.

It has been found that an advantageous flow is obtained in particular if said at least one rotary element comprises a number of elongated rotary members arranged in a circular pattern around and parallel to said further rotary shaft, which rotary members may advantageously be rod-shaped.

In order to reduce the consumption of electrolytic fluid it is preferable if the device further comprises recirculation means for recirculating the electrolytic fluid in the bath. The electrolytic fluid thus moves out of the bath (temporarily), it may subsequently be cleaned/filtered, after which it is returned to the bath.

In particular for use in the electrolytic treatment of substrate material formed by relatively light or relatively flexible discrete plates or by strip material being unwound from a reel, it may be advantageous if the conveying means further comprise hold-down means for pressing the substrate down against the action of the spring means, at least at the location of the electrolytic part of the respective conveying paths.

In order to prevent frictional contact as much as possible upon such pressing down of the substrate, the hold-down means may move along in the conveying direction with the substrate at the location where contact is made with the substrate, for example in that the hold-down means are configured as rollers or belts.

The invention will be explained in more detail below by means of a description of a possible embodiment of the device according to the invention, in which reference is made to the following figures.

Figure 1:
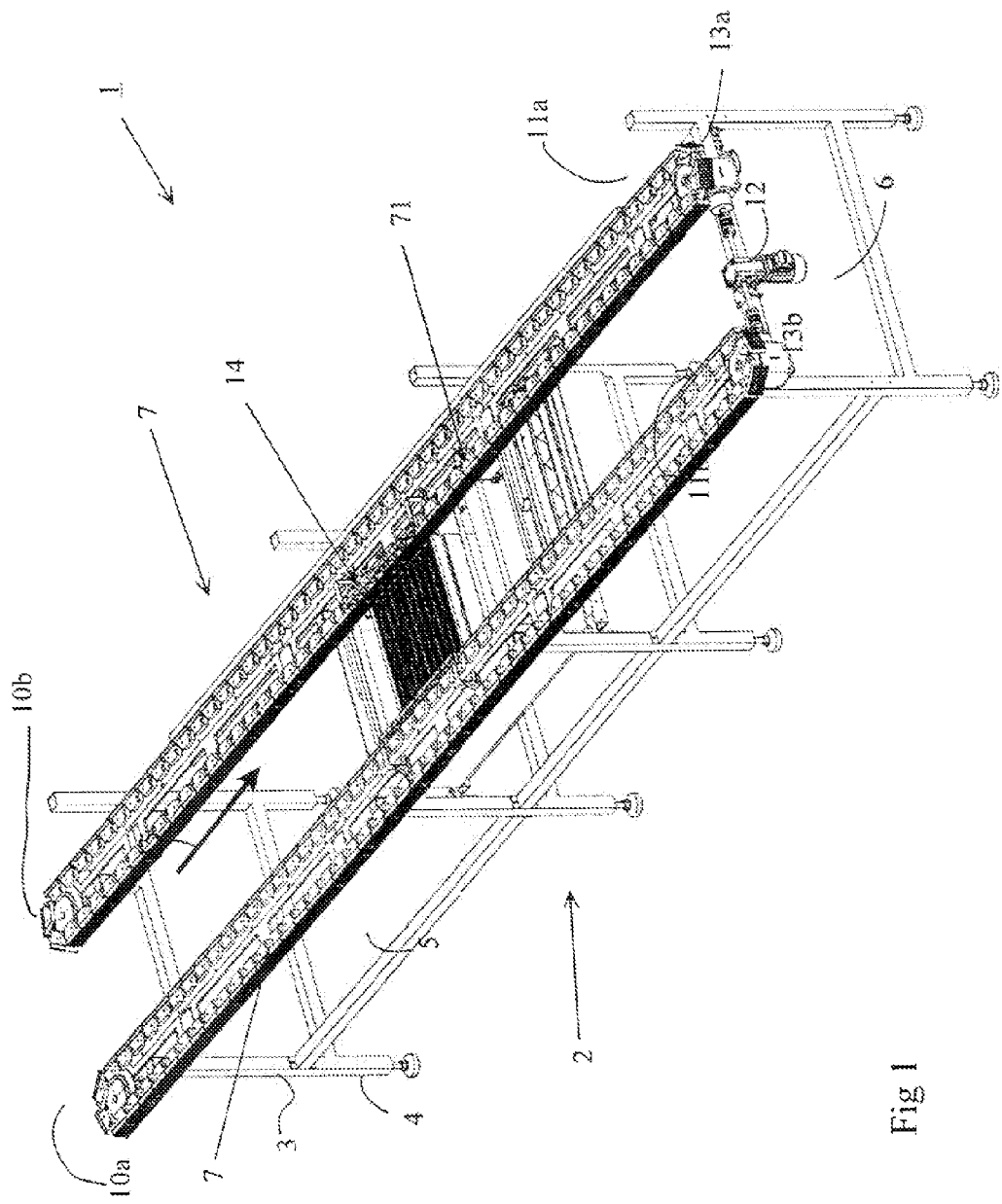
FIG. 1 is an isometric view of a possible embodiment of a device according to the invention.
Figure 2:
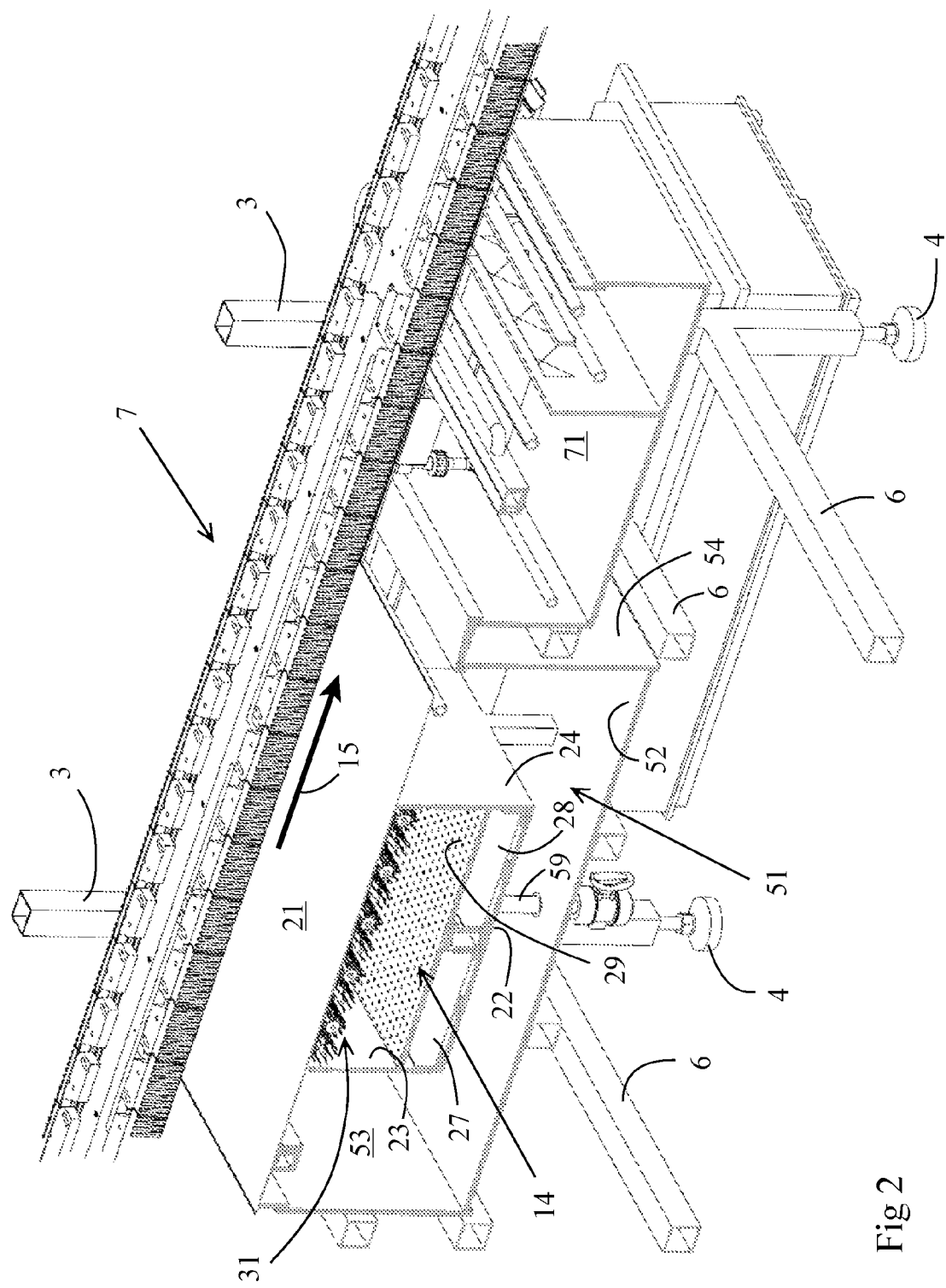
FIG. 2 is an isometric longitudinal sectional view of the device of FIG. 1.
Figure 5B:
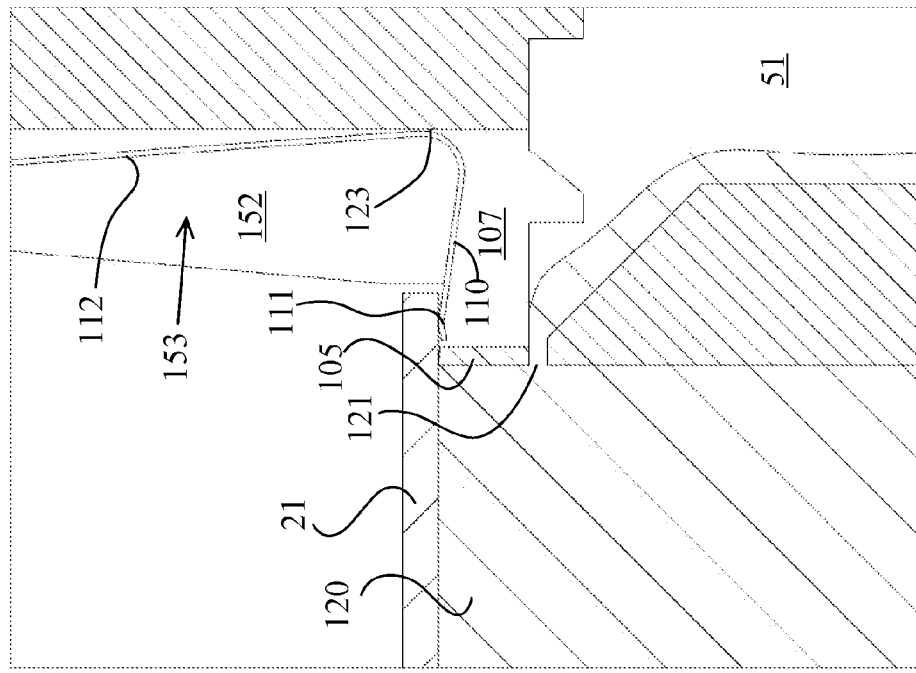
FIGS. 5a and 5b are vertical cross-sectional views showing a spring lip that forms part of the conveying element of the device of FIG. 1 in loaded condition and in unloaded condition, respectively.
Figure 6:
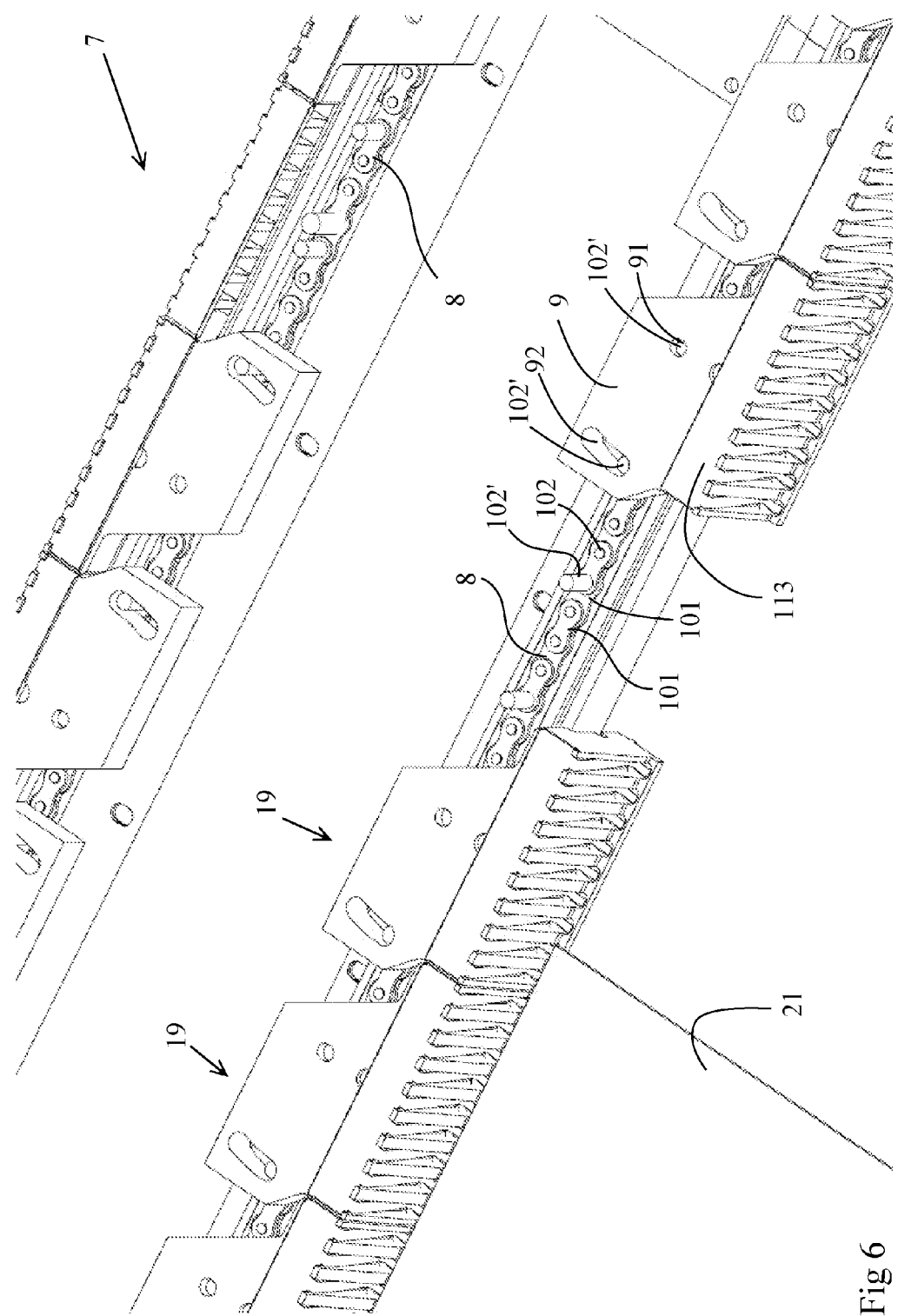
FIG. 6 is an isometric view showing part of the forward part and the return part of a conveying element forming part of the device of FIG. 1.

FIG. 1 shows a device 1 according to the invention for single-sided electrolytic treatment of a flat substrate 21 (see also FIGS. 2, 5*b* and 6). The device 1 comprises a frame 2. The frame 2 is made up of uprights 3 having adjustable legs 4, longitudinal girders 5 and cross girders 6, which girders 5, 6 interconnect the uprights 3. For the sake of clarity not all longitudinal girders 5 are shown in FIG. 1.

The device 1 further comprises two opposite conveying elements 7 disposed on two opposite long sides of the frame 2. Each of the two conveying elements 7 comprises an endless conveyor chain 8 with an endless row of link elements 19 connected thereto, which link elements are each at least essentially made up of a carrier body 9 and a guide member 81, which will be discussed in more detail yet hereinafter (see also FIGS. 4 and 8). In FIG. 6 a complete link element 19 is left out from the forward (inner) part of the endless path followed by the conveying element 7, whilst only the guide member 18 of a link element 19 of the return part is shown. The conveyor chain 8 (FIG. 4) of each of the conveying elements 7 passes over two sprocket wheels 10*a*, 10*b* and 11*a*, 11*b*. The sprocket wheels 11*a*, 11*b* can be driven synchronously in opposite directions by means of an electric motor 12 and right-angled transmissions 13*a*, 13*b*. The conveying elements 7 are supported by the frame 2.

The frame 2 further supports an electrolytic bath 14 containing, at least in use, an electrolytic fluid 120 (see FIGS. 5*a*, 5*b*) as known to those skilled in the art. As will be explained in more detail yet hereinafter, it is possible, using the conveying elements 7, to carry plate-shaped flat substrates 21, for example made of a vitreous material that is provided with a thin electrically conductive layer on the underside, in a horizontal orientation between the two facing sides of the conveying elements 7, in a conveying direction 15 over the electrolytic bath 14, such that the underside of the flat substrate makes contact with the upper side of the electrolytic fluid 120 in the electrolytic bath 14, whilst the upper side of the substrate in principle does not make contact with the electrolytic fluid 120 present in or at least originating from the bath 14. Thus it is possible to apply a layer to the underside of the substrate 21 in question by electrolytic means.

Figure 3:
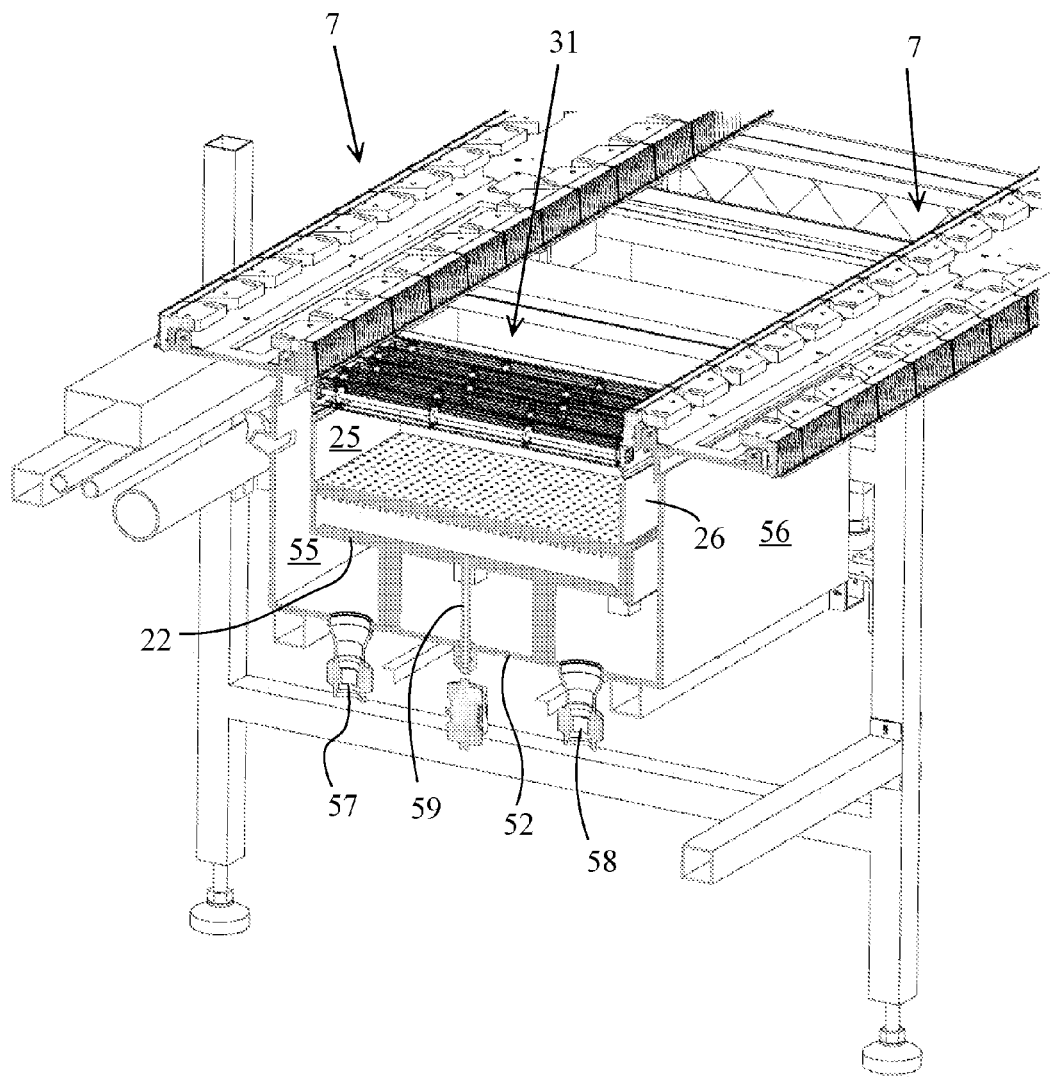
FIG. 3 is an isometric cross-sectional view of the device of FIG. 1.
Figure 4:
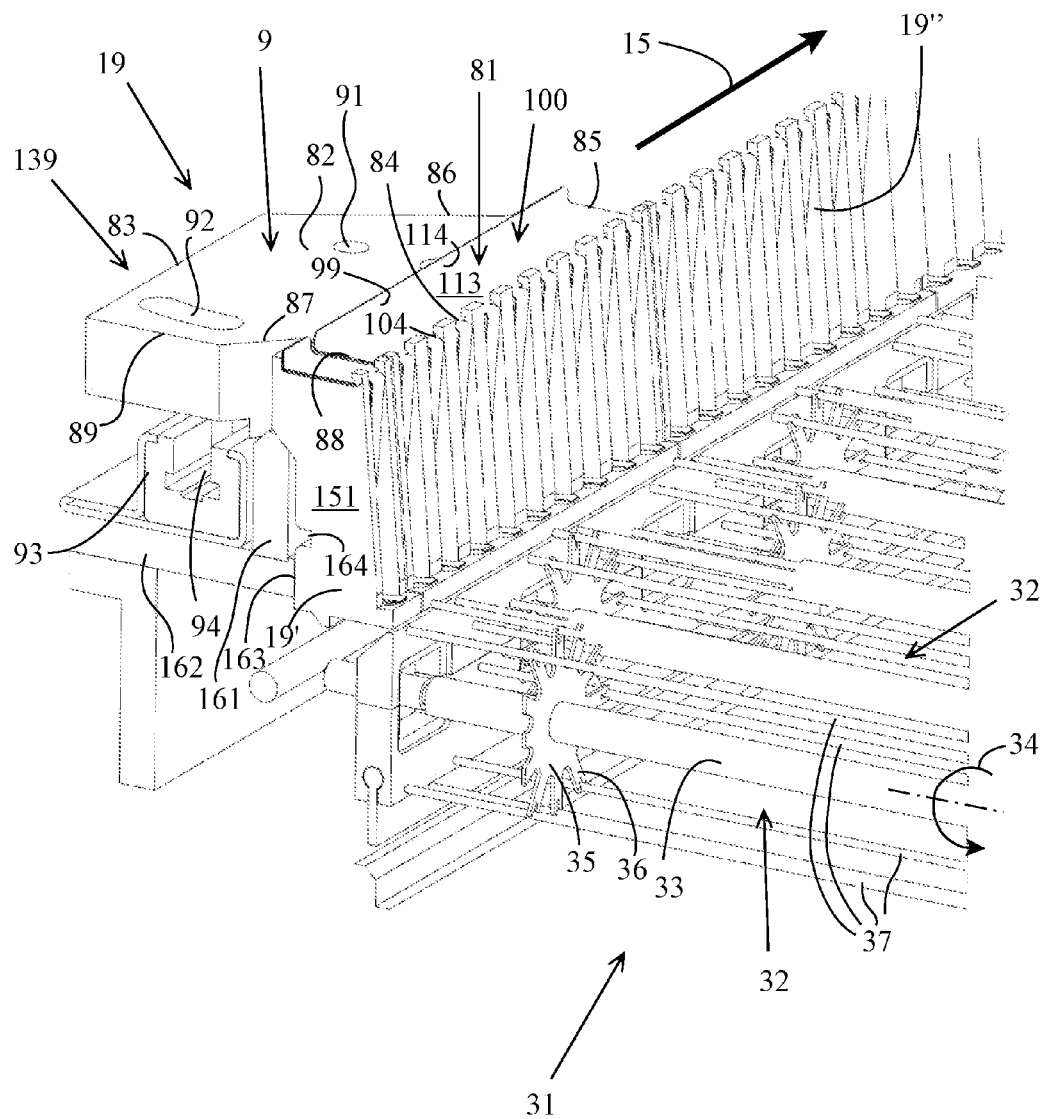
FIG. 4 is a more detailed view of a part of FIG. 3.

FIGS. 2, 3 and 4 show in different isometric views and sectional views the area surrounding the electrolytic bath 14 including, at least in FIG. 2, a substrate 21. The electrolytic bath 14 comprises a bottom 22, an upstream transverse wall 23, a downstream transverse wall 24, and two opposite longitudinal walls 25, 26. Provided on the bottom 22 of the electrolytic bath 14 are two anode containers 27, 28 which, in use, contain anodic material, for example in the form of metal balls, which material dissolves in the electrolytic fluid during the electrolytic process and subsequently precipitates again on the underside of the substrate 21. The anode containers 27, 28 are made of an electrically conductive material, they are anodically connected during the electrolytic process, that is, to the positive side of a rectifier.

Provided above the anode containers 27, 28 is a horizontal distributor plate 29, which extends over the full area of the bottom 22. The distributor plate 29 is provided with holes arranged in a regular pattern. The distributor plate 29 contributes to the homogenisation of the field lines that extend from the anodic material in the anode containers 27, 28 to the substrate 21 during the electrolytic process.

Provided in the upper part of the electrolytic bath 14 are agitator means 31, which function to create a flow of electrolytic fluid in the direction opposite the conveying direction 15 in the electrolytic bath 14, along the underside of the substrate 21, so as to increase the efficiency of the electrolytic process. The agitator means 31 (see in particular FIG. 4) comprise a number of rotary wheels 32 arranged one after the other. Each rotary wheel 32 comprises a horizontal shaft member 33, which is rotatable about its central axis as indicated by the arrow 34, which shaft member extends transversely to the conveying direction 15. The shaft members 33 each carry, distributed along their length, a number of more or less star-shaped disc members 35 provided with regularly spaced points 36. Each point 36 has a U-shaped recess, in which a rod 37 can be clamped. The rods 37 associated with each rotary wheel 32 extend, at least substantially, over the entire width of the electrolytic bath 14, being provided in a circular pattern around and parallel to the shaft member 33. The rotary motion of the rotary wheels 32 arranged one after the other ensures that the electrolytic fluid in the electrolytic bath 14 flows in counterflow to the substrate 21, at least in the immediate vicinity of said substrate 21.

The electrolytic bath 14 is disposed in an overflow bath 51. The overflow bath 51 has a bottom 52, an upstream transverse wall 53, a downstream transverse wall 54 and two longitudinal walls 55, 56. In use, electrolytic fluid 120 flowing out of an electrolytic bath 14 (more about this below), will flow into the overflow bath 51. Two outlet openings 57, 58 are provided in the bottom 52 of the overflow bath 51. Said outlet openings 57, 58 form part of a recirculation circuit (not completely shown in the figures) which connects to the outlet openings 57, 58. Set recirculation circuit includes a pump as well as filter means/cleaning means for filtering/cleaning electrolytic fluid 120 that has flown out of the overflow bath 51 via the outlet openings 57, 58 to be subsequently supplied again via the supply line 59 that extends through the bottom 52 of the overflow bath 51 and terminates in the bottom 22 of the electrolytic bath 14, and that between the two anode containers 27, 28.

Downstream of the overflow bath 51, the device 1 comprises a cleaning station 71. The cleaning station 71 is intended for cleaning the substrate 21 directly after it has been subjected to the electrolytic treatment at the electrolytic bath 14, to which end the cleaning station 71 is provided with blow and spray nozzles.

FIG. 4 is a more detailed view of a link element 19 mainly consisting of a carrier body 9 with an associated guide member 81 supported by the carrier body 9. The carrier body 9 is made of a dielectric plastic material such as polyoxymethylene (POM). To prevent any misunderstanding, it is noted that in FIG. 4 limited parts 19', 19" of an upstream and a downstream link element, respectively, are shown.

The carrier body 9 comprises a horizontally extending part 139 having an upper surface 82 whose circumference is defined by an inner longitudinal edge 83, an inclined front edge 86, a transverse front edge 85, an outer longitudinal edge 84, an outer transverse front edge 88, an inclined rear edge 87 and an inner transverse front edge 89. Two through holes 91, 92 are provided in the upper surface 82. The hole 91 is a round hole. The hole 92 is a slotted hole which concentrically surrounds the centre of the round hole 91.

The upper surface 82 extends above a stationary guide member 93, which is mounted to the frame 2. The stationary guide member 93 extends substantially along the entire length of the two straight parts of the two endless conveying paths for the conveying elements 7. Each stationary guide member 93 is provided with a longitudinal groove 94, which is open at the upper side. A conveyor chain 8 extends within the longitudinal groove 94 (see also FIG. 6). The conveyor chain 8 has links 101, which are pivotally interconnected via pivot pins 102. The pivot pins 102' are lengthened at regularly spaced intervals, so that they also extend above the links 101, viz. into the holes 91, 92. When the conveyor chain 8 is driven, this will therefore result in the carrier bodies 9 being conveyed along the endless conveying path as well.

Figure 8:
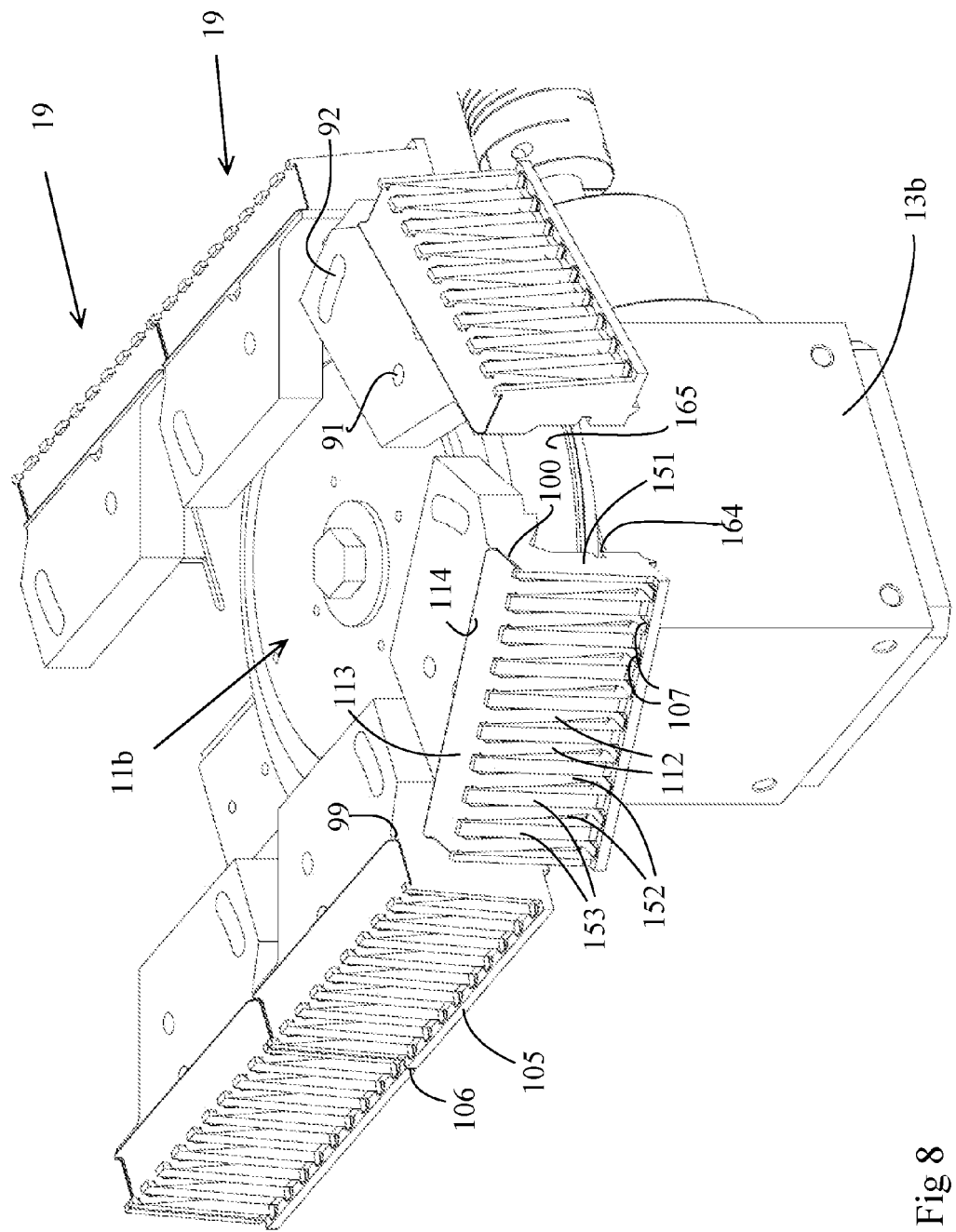
FIG. 8 is an isometric view showing the area around a sprocket wheel that forms part of the device of FIG. 1.

The rectangular part of the upper surface 82 that is defined by the transverse front edge 85, the outer longitudinal edge 86 and the outer transverse front edge 87 is largely recessed (numeral 100), as is visible in particular for the carrier body 9' shown in sectional view in FIG. 4 but also in FIG. 8. The carrier body 9 has an upright stop edge 99 at the location of the transition between the recessed part 100 and the remaining part of the upper surface 82.

The carrier body 9 is provided with a downwardly extending part 151 at least substantially below the recessed part 100. As is also shown in FIG. 8, the carrier body 9 is provided with vertically extending grooves 152 on the outer side of the downwardly extending part 151, with vertical edges 153 present therebetween. The edges 153 extend above the level of the recessed part 100, they each have a horizontal groove 104 directed towards the recessed part 100. At the bottom side of the downwardly extending part 151, the carrier body 9 is provided with a support edge 105 directed toward the outer side, which support edge continues on the outer side of the conveying element 7 (i.e. on the side facing toward the electrolytic bath 14), and which has a length equal to that of the outer longitudinal edge 86. The support edges 105 of successive carrier bodies 9 butt closely together, leaving only a very limited gap 106 therebetween. Provided in the support edge 105, in line with the grooves 152 and between the edges 153, therefore, are recesses 107.

Figure 5A:
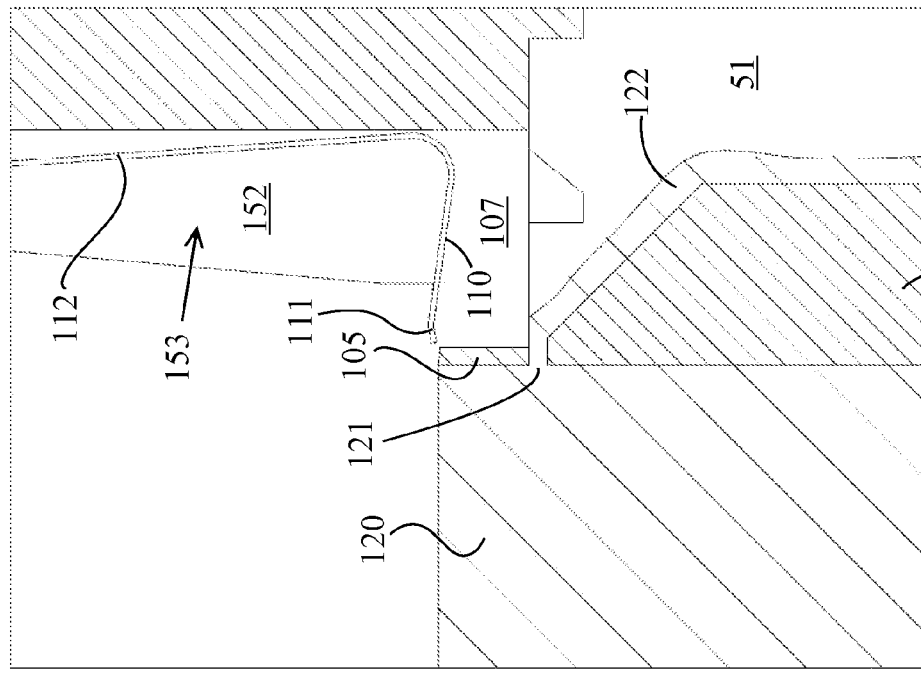

Each of the recesses 107 provides space for a spring-loaded contact lip 110 (FIGS. 5a and 5b). The contact lip 110 has a free end, in the immediate vicinity of which a slight upwardly bent part 111 functioning as a contact element is provided. In use, the (upper side of the) contact lip 110 butts against the underside of a substrate 21 at the location of said bent part 111 (FIG. 5b). The contact lip 110 extends at least substantially horizontally, abutting an at least substantially vertically extending spring arm 112 on the side remote from the free end, which spring arm is located within the grooves 152. At their upper ends, the spring arms 112 abut a horizontal contact plate 113 having a flanged edge 114. The contact plate 113 lies on the recessed part 100 of the upper surface 82, being clamped between the stop edge 99 and the horizontal grooves 104. Together with the flanged edge 114, the spring arms 112 abutting the contact plate 113 and the contact lips 110, the contact plate 113 forms the guide member 81, which is entirely made of an electrically conductive material, such as copper or spring steel (stainless steel 301). Said guide member 81, one of which is provided for each carrier body 9, can be readily exchanged, if desired, by levering the contact plate 113 off the stop edge 99 at the location of the flanged edge 114, after which the contact plate 113 can come out of the horizontal grooves 104 and the guide member 81 can be removed so as to be exchanged for another guide member 81.

As is shown in FIG. 5a, the bent part 111 of the contact lip 110 extends just above (for example 1-2 mm) above the upper side of the support edge 105 in the unloaded condition, that is, without a substrate 21 being present. As is also shown in FIG. 5a, the electrolytic bath 4 is filled with an electrolytic fluid 120, and that precisely to the level of the upper side of the support edge 105. Any electrolytic fluid 120 flowing over the support edge 105 will subsequently flow into the overflow bath 51 via the recess 107, which is a through recess, and via the outer side of the longitudinal wall 25. FIGS. 5a and 5b furthermore clearly show that the support edge 105 and the longitudinal wall 25 are in line with each other, at least on the side that faces toward the electrolytic fluid 120. Present between the support edge 105 and the longitudinal wall 25 is a narrow gap 121, which has a typical height of, for example, 1 mm. Numeral 122 indicates how electrolytic fluid 120 flows into the overflow bath 51 via the gap 121. Because of this configuration, the support edge 105, which moves in the conveying direction 15, can also be regarded as a (moving) part of the longitudinal wall for the electrolytic bath 4.

FIG. 5b shows how a substrate 21 is supported on the support edge 105 on one longitudinal side. Because of said support, electrolytic fluid 120 is in any case prevented from flowing over the support edge 105 unless the substrate 21 is pushed up temporarily under the influence of an increased pressure in the electrolytic fluid 120, which will not happen during normal operation.

Figure 9:
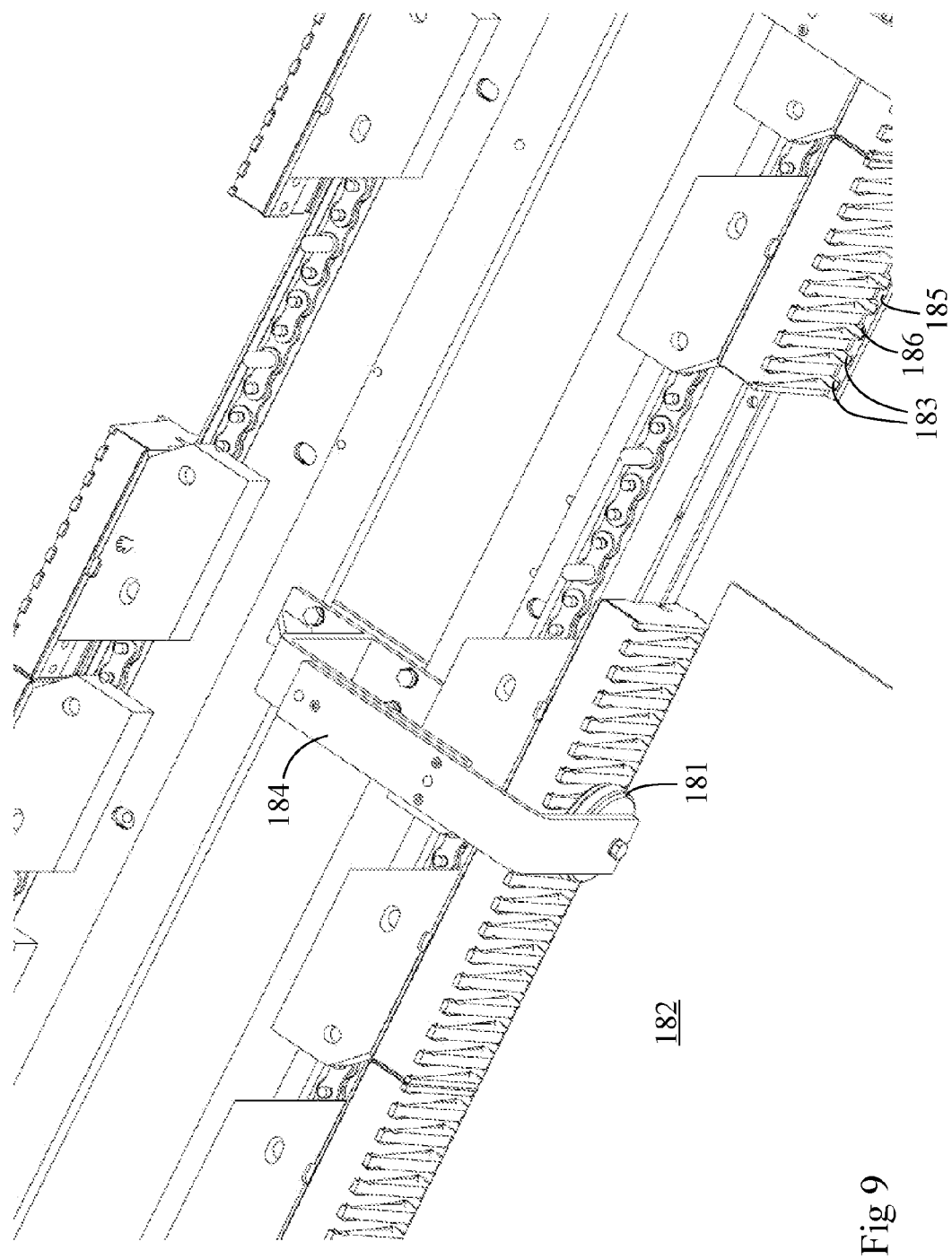
FIG. 9 is an isometric view comparable to the view shown in FIG. 7, which shows part of a variant of the device as shown in the preceding figures.

In order to suppress this possible tendency, which might manifest itself in particular if the substrate is not a discrete plate having a considerable self-weight but a relatively light discrete plate or strip from a reel, it is also possible within the framework of the present invention to make use of hold-down belts or hold-down rollers which push the substrate down in the direction of the support edge 105 and the contact lips 110, in any case within the length of the bath 14. Reference is made within this framework to FIG. 9, which relates to an alternative embodiment of a device 180 according to the invention, which device 180 is rather similar to the device 1. The device 180 comprises stationary hold-down rollers 181, only one of which is shown in FIG. 9, which rollers are provided within the length of the electrolytic bath, on opposite sides thereof. The hold-down rollers 181 are each connected to a bracket 184, being freely rotatable about horizontal axes of rotation extending perpendicularly to the conveying direction. The bracket 184 may be configured so that each hold-down roller 181 presses onto the substrate 182 with a slight bias. In this way it is ensured that there will be contact between the underside of the substrate 182 and the contact lips 183, which slightly project above the support edge 185 in the unloaded condition. The support edge 185 is provided with recesses 184 for each of the contact lips 183. The hold-down force exerted by the hold-down rollers 181 ensures that the contact lips 183 are pressed down to the level of the support edge 185, and that the substrate 185 will at least substantially be supported on the support edge 185. In FIG. 9 the substrate 182 is plate-shaped, but the use of the hold-down rollers 181 may also be advantageous in particular if the substrate is formed by a part of a strip unwound from a reel. As an aside it is furthermore noted that the carrier body 187 of the device 180 is different from the carrier body 9 because of the different position and orientation of the circular all 188 and the slotted hole 89 into which extended pins of the chain 190 extend. The slotted hole 189 extends in the conveying direction so as to provide space for the arc-chord effect that occurs at the location of the sprocket wheels 10a-11b.

Returning to the description of FIG. 5b, the contact lip 110 has been pressed down onto the side of the support edge 105 remote from the electrolytic fluid 120 under the influence of the weight of the substrate 21, with the bent part 111 making contact with the underside of the substrate 21 with a certain bias. Furthermore, the lower part of the spring arm 112 butts against the inner side of the groove 152 at the location indicated at 123. The support edge 105 (together with the substrate 21) forms a screen which prevents (at least to a significant degree) electrolytic fluid 120 from the electrolytic bath 4 from coming into electrically conductive contact with electrolytic fluid 120 in or at least from the electrolytic bath 4, which would result in electrolytic precipitation of material on the contact lip 110 as well. Such precipitation would necessitate quite frequent cleaning of the contact lips 110, and thus also of the entire associated guide member 81, of course. Owing to the screening of the contact lip 110 by the support edge 105, the frequency with which such cleaning is to be carried out is at least significantly reduced.

A first further guide member 161 and a second further guide member 162 are provided parallel to the guide member 93 for guiding the movement of the link elements 19, at least along the straight parts of the endless conveying paths of the conveying means 7. Both guide members 161, 162 are stationary guide members. The first further guide member 161 has a pointed upper edge. In the corner between the parts 139 and 151 of the carrier body 9, the carrier body 9 is provided with a groove having a shape which is complementary to that of the pointed upper edge of the guide member 161. The second further guide member 162 is provided with a stop edge on the side facing the downwardly extending part 151 of the carrier body 9, against which the stop side 163 on the bottom side of the part 151 butts in use. Thus the carrier bodies 9 are slidingly guided by the further guide members 161, 162.

Above the stop side 163, each carrier body 9 is provided with a guide groove 164. At the location of each of the sprocket wheels 10a-11b, said guide grooves 154 guidingly cooperate with a part of the circumferential edge of the moving disc-shaped guide member 165 (see FIG. 8). Thus the link elements 19 are guided also in the semicircular parts of the endless conveying paths.

Figure 7:
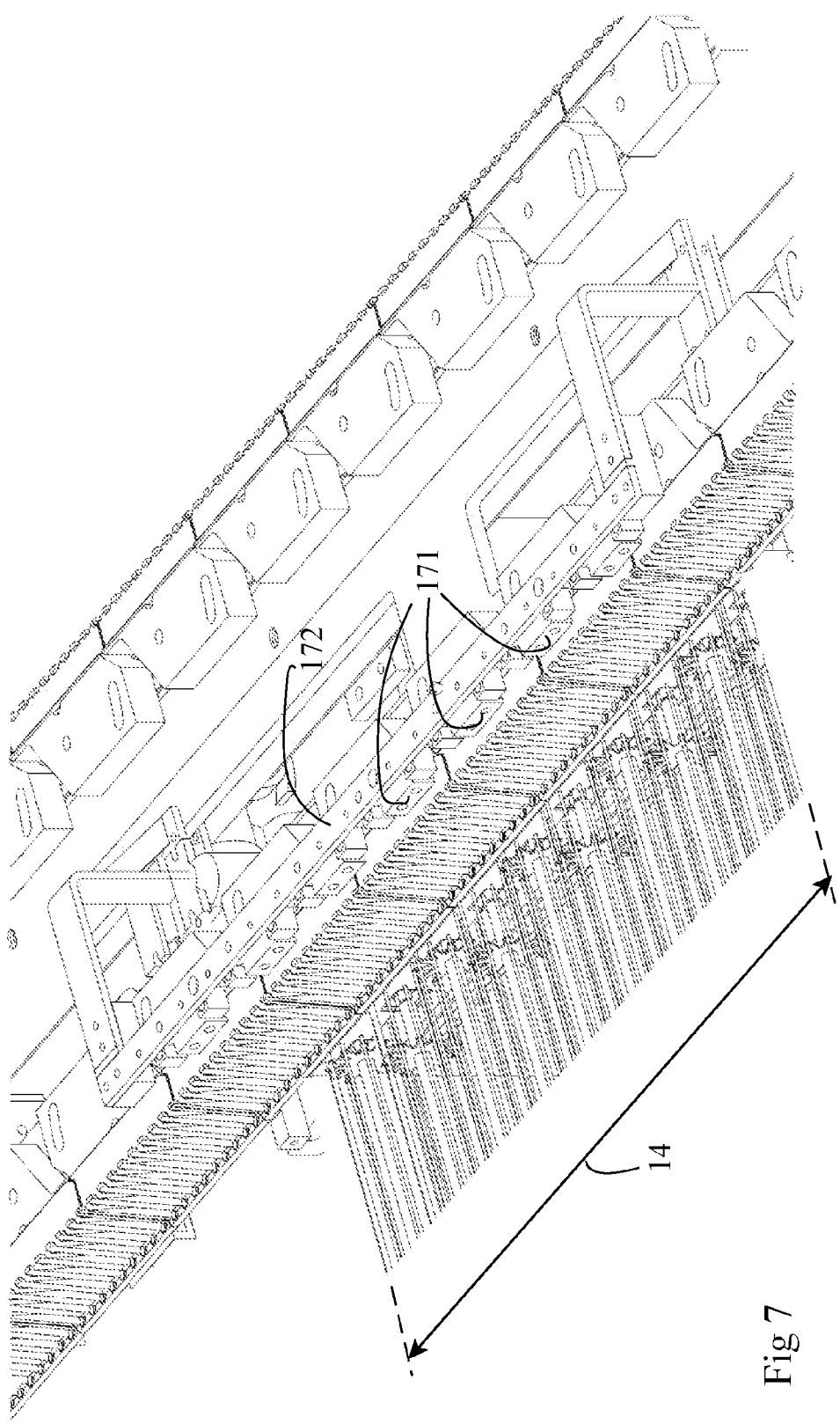
FIG. 7 is a more detailed isometric view of a part of the device of FIG. 1.

FIG. 7 shows an important part of the means with which the device 1 is provided for connecting at least the underside of the substrate 21 negative for the purpose of attracting ions dissolved in the electrolytic bath 14, as is known per se for electrolytic processes. The device 1 is to that end provided with a number of stationary contact members 171 arranged one behind another at regular intervals, which contact members are attached to the underside of a strip 172, which is in turn attached to the frame 2. The contact members 171 are each connected to the negative side of a rectifier (not shown) and, in use, make sliding contact with the upper sides of contact blades 113 of the contact members 81, the associated link elements 19 of which are located beside (i.e. within the length of) the electrolytic bath 14. The row of contact members 171 extends along the entire length of the electrolytic bath 14. The spacing between the contact members 171 is smaller than the pitch distance between the link elements 19. Thus, at least one contact member 171 is in contact with the guide member 81 at all times, at least within the length of the electrolytic bath. On account of the electrically conductive properties of the material of the guide member 81, the negative voltage that is transferred via the contact plates 113 is transferred to the contact lips 110 and, via the bent parts 11 thereof, to the (underside of) the substrate 21. The use of a relatively large number of contact lips 110 within their relatively small length makes it possible to achieve relatively high current densities, with the field lines moreover being of a relatively homogeneous nature, so that the electrolytic process can take place with a high degree of efficiency.

The supply of (discrete) substrates 21, 182 to be treated can take place by lowering such substrates from above, just downstream of the sprocket wheel's 10a, 10b, onto the support edges 105, 185 of the two opposite conveying means 7, whilst the discharge of treated substrates 21, 182 can take place by lifting the treated substrates from the support edges 105, 185 again just downstream of the sprocket wheels 11a, 11b. Alternatively it is also possible to supply the substrates 21, 182, or possibly a strip-shaped substrate, in horizontal direction parallel to the conveying direction 15 at the location of the sprocket wheels 10a, 10b and discharge them in the same direction at the location of the sprocket wheels 11a, 11b. It is also possible to arrange a number of devices according to the invention one behind the other, in which case the substrates 105, 185 will be transferred from one device to a next device.

The present invention is not limited to the embodiment as described in the foregoing, its scope in the first place being determined by the appended claims.

The invention claimed is:
1. A device for single-sided electrolytic treatment of a flat substrate, comprising
   a bath for electrolytic fluid, wherein the bath for electrolytic fluid has a free surface,
   a conveying means for conveying the flat substrate in a conveying direction at the free surface of the electrolytic fluid in the bath,
      wherein the conveying means is configured to convey the flat substrate in a horizontal orientation such that the underside of the flat substrate is able to make contact with the free surface of the electrolytic fluid in the bath,
      said conveying means comprising two conveying elements disposed opposite each other,
      wherein the two conveying elements extend along two respective conveying paths,
      wherein the two conveying paths each comprise an electrolytic part which each extend on two opposite longitudinal sides of the bath,
      wherein each of the two conveying elements comprises
         at least one carrier body of a dielectric material, wherein each carrier body has, at least at the location of the associated electrolytic part, a support edge directed toward the bath for supporting, with an upper side thereof, the flat substrate on one side thereof, which support edge forms a moving part of a longitudinal wall of the bath, and
         at least one guide member of an electrically conductive material, wherein the at least one guide member is connected to said at least one carrier body for cathodically connecting the underside of the substrate on the side of the support edge remote from the bath,
            wherein the at least one guide member comprises at least one spring means having an upper side which, in unloaded condition, is located above the level of the upper side of the support edge, at least at the location of the bath, the upper side of which spring means is elastically compressible in a downward direction under the influence of a downward force exerted on the spring means by the substrate, to the level at which the upper side of the spring means is located at the same level as the upper side of the support edge.

2. The device according to claim 1, wherein the support edge forms a screen for preventing the electrolytic fluid coming into contact with said at least one spring means from the bath.

3. The device according to claim 1, wherein the conveying means are provided with a number of spring means for each carrier body.

4. The device according to claim 3, wherein at least one recess is provided in each support edge for each accommodating at least one spring means associated with the carrier body.

5. The device according to claim 4, wherein each support edge has a continuous part on the side facing the bath and wherein said at least one recess is provided on the side of the continuous part remote from the bath.

6. The device according to claim 1, wherein each guide member is provided with a number of spring means.

7. The device according to claim 1, wherein the spring means are configured as spring lips.

8. The device according to claim 1, wherein each carrier body is provided with a single guide member.

9. The device according to claim 1, wherein said at least one guide member is exchangeably connected to the associated at least one carrier body.

10. The device according to claim 9, wherein said at least one guide member is connected to the associated at least one carrier body by means of a snap connection.

11. The device according to claim 1, wherein the device further comprises cathodic contact means which are in electrically conducting contact, or at least can be placed into electrically conducting contact, with said at least one guide member at the location of the electrolytic part.

12. The device according to claim 1, wherein each of the conveying paths is an endless conveying path.

13. The device according to claim 12, wherein each conveying element comprises an endless row of successive carrier bodies.

14. The device according to claim 12, wherein the successive carrier bodies of each conveying element are pivotally interconnected about pivot axes via the conveying element.

15. The device according to claim 14, wherein said pivot axes extend vertically.

16. The device according to claim 12, wherein the conveying elements each comprise an endless conveyor chain which passes over two sprockets, upstream and downstream of the bath, respectively, which sprockets are rotatable about axes of rotation, wherein carrier bodies associated with the respective conveying element are pivotally interconnected about pivot axes via the conveyor chain.

17. The device according to claim 16, wherein said axes of rotation extend vertically.

18. The device according to claim 16, wherein the pivot axes are formed by pivot pins of the conveyor chain, which extend outside links of the conveyor chain, which pivot pins pivotally interconnect the links of the conveyor chain.

19. The device according to claim 18, wherein each conveying element is connected to the associated conveyor chain via two pivot pins, wherein one of the two pivot pins extends into a circular hole provided in the conveying element and the other of the two pivot pins extends into a slotted hole of the conveying element.

20. The device according to claim 1, wherein the bath has two opposite stationary longitudinal walls.

21. The device according to claim 1, wherein the bath has a transverse wall both on the upstream side of the bath and on the downstream side of the bath, the upper sides of which transverse walls extend at most 5 mm, below the level of the upper sides of the support edge.

22. The device according to claim 1, wherein the bath is provided with agitator means comprising at least one rotary element which rotates about a further rotary shaft, which further rotary shaft extends transversely to the conveying direction in the fluid in the bath so as to create a counterflow of electrolytic fluid near the substrate.

23. The device according to claim 22, wherein said at least one rotary element extends over at least substantially the entire width of the bath.

24. The device according to claim 22, wherein said at least one rotary element comprises a number of elongated rotary members arranged in a circular pattern around and parallel to said further rotary shaft.

25. The device according to claim 24, wherein said rotary members are rod-shaped.

26. The device according to claim 1, wherein the device further comprises recirculation means for recirculating the electrolytic fluid in the bath.

27. The device according to claim 1, wherein the conveying means further comprise hold-down means for pressing the substrate down against the action of the spring means, at least at the location of the electrolytic part of the respective conveying paths.

28. The device according to claim 27, wherein the hold-down means move along in the conveying direction with the substrate at the location where contact is made with the substrate.

29. The device according to claim 28, wherein the hold-down means are configured as rollers or belts.

* * * * *